United States Patent [19]

Gladik et al.

[11] Patent Number: 5,357,671
[45] Date of Patent: Oct. 25, 1994

[54] DEVICE FOR LOADING AN ADAPTER FOR A DEVICE FOR TESTING PRINTED CIRCUIT BOARDS

[75] Inventors: Heimo Gladik, Dornstatdt-Temmenhausen; Hans-Hermann Higgen, Stadthagen; Ruediger Dehmel; Martin Maelzer, both of Wunstorf, all of Fed. Rep. of Germany

[73] Assignee: Luther & Maelzer GmbH, Wunstorf, Fed. Rep. of Germany

[21] Appl. No.: 120,741

[22] Filed: Sep. 14, 1993

Related U.S. Application Data

[62] Division of Ser. No. 768,857, Oct. 8, 1991, Pat. No. 5,285,149.

[30] Foreign Application Priority Data

Feb. 16, 1990 [DE] Fed. Rep. of Germany ....... 4004933
Nov. 12, 1990 [DE] Fed. Rep. of Germany ....... 4035978

[51] Int. Cl.$^5$ .............................................. H05K 3/30
[52] U.S. Cl. ....................................... 29/739; 29/759; 324/158 F; 324/158 P
[58] Field of Search .................... 29/739, 741, 759; 324/158 F, 158 P

[56] References Cited

U.S. PATENT DOCUMENTS

| | | | |
|---|---|---|---|
| 3,963,456 | 6/1976 | Tsuchiyawa et al. | 29/739 |
| 4,423,376 | 12/1983 | Byrnes et al. | 324/158 |
| 4,535,536 | 8/1985 | Wyss | 29/845 |
| 4,749,943 | 6/1988 | Black | 324/158 |
| 4,774,462 | 9/1988 | Black | 324/158 |
| 4,788,496 | 11/1988 | Maelzer et al. | 324/158 |
| 4,823,079 | 4/1989 | Barth | 324/158 |
| 4,834,659 | 5/1989 | Mang et al. | 439/55 |

FOREIGN PATENT DOCUMENTS

| | | |
|---|---|---|
| 0144682 | 10/1984 | European Pat. Off. |
| 0164722 | 12/1985 | European Pat. Off. |
| 0238886 | 2/1987 | European Pat. Off. |
| 0315707 | 11/1987 | European Pat. Off. |

*Primary Examiner*—Carl E. Hall
*Attorney, Agent, or Firm*—Fitzpatrick, Cella, Harper & Scinto

[57] ABSTRACT

A method and a device for loading an adapter for a printed circuit board testing device with adapter pins having head ends and contact ends. The adapter pins to be loaded into the adapter are transferred by gravity from at least one main magazine, with their head ends first, into an intermediate magazine. Also, the adapter pins that have been transferred into the intermediate magazine are then transferred by gravity with the contact ends first into the adapter. For simpler and more rapid loading of the adapter with minimal constructional outlay, the adapter pins are transferred from the main magazine head first into the intermediate magazine.

17 Claims, 5 Drawing Sheets

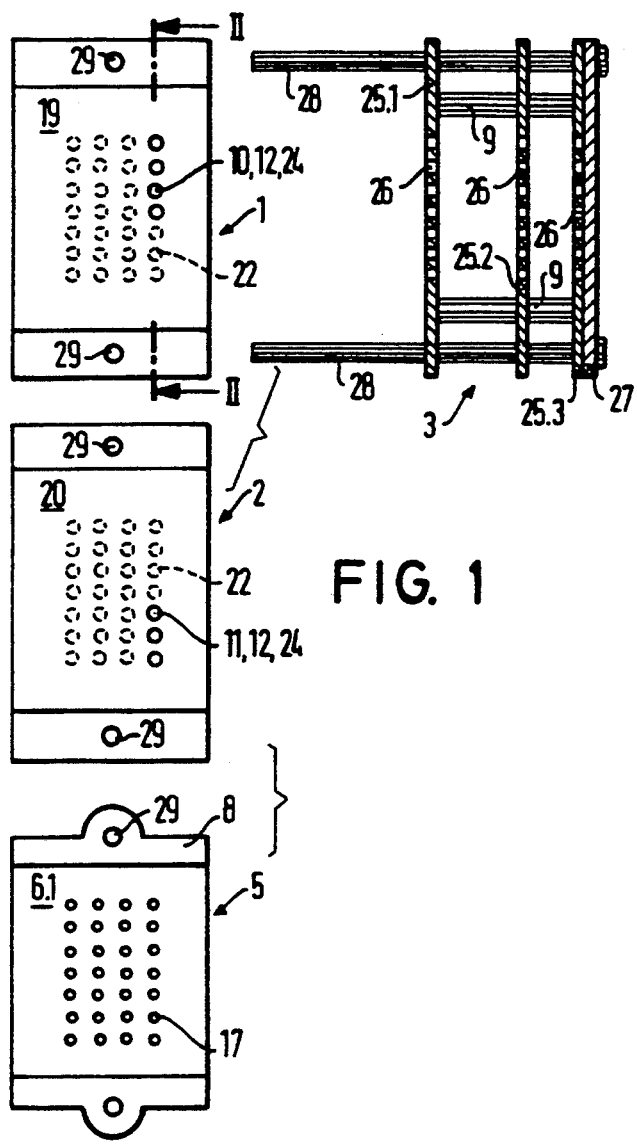
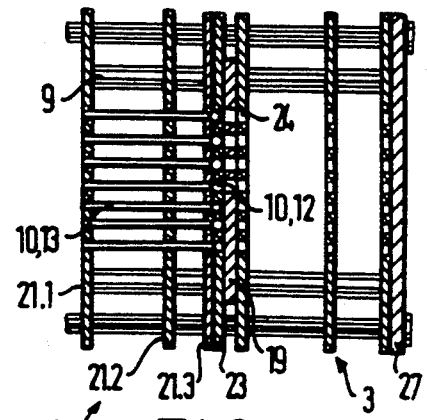
FIG. 1
FIG. 2
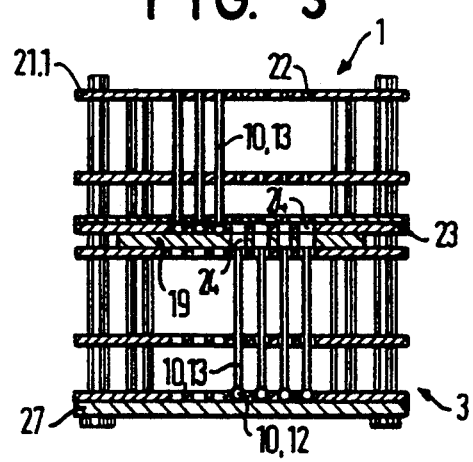
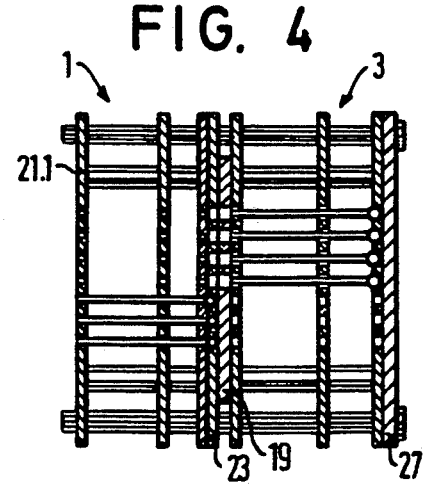
FIG. 3
FIG. 4

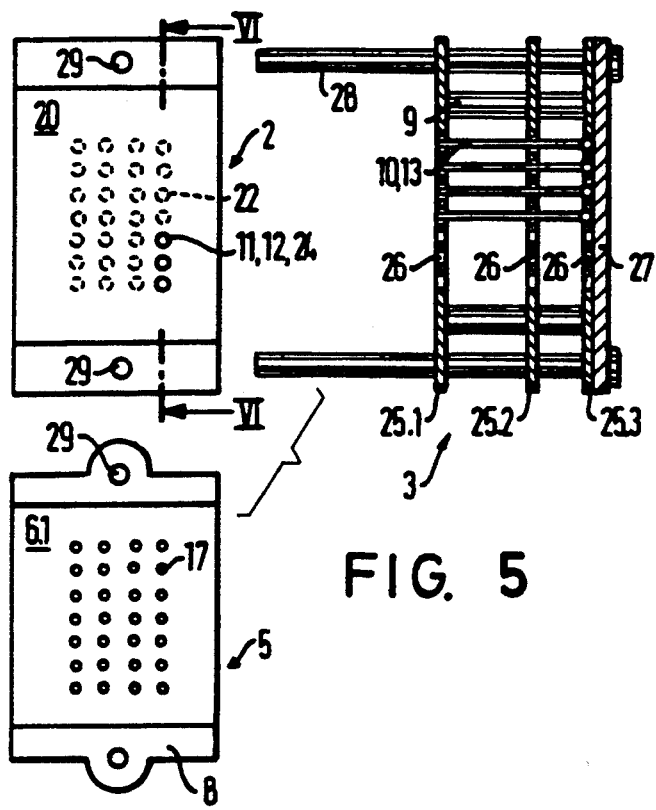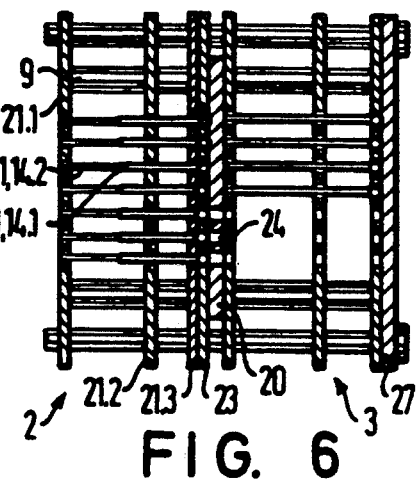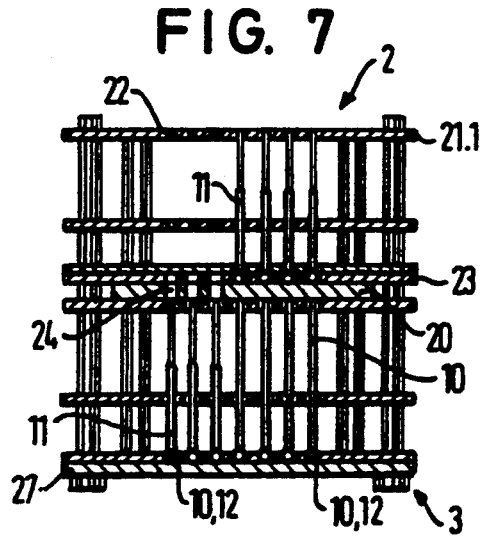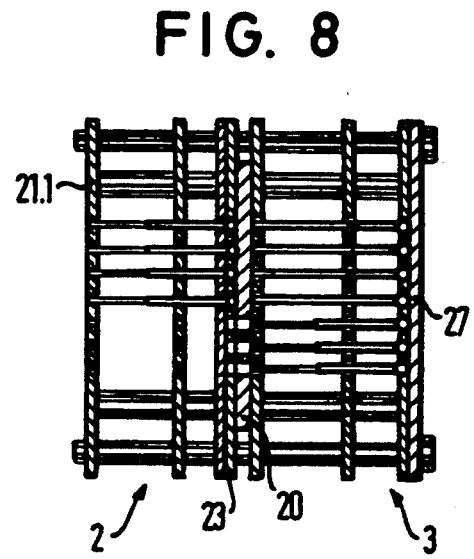

DEVICE FOR LOADING AN ADAPTER FOR A DEVICE FOR TESTING PRINTED CIRCUIT BOARDS

This application is a division of application Ser. No. 07/768,857 filed Oct. 8, 1991 now U.S. Pat. No. 5,285,149, issued Feb. 8, 1994.

BACKGROUND OF THE INVENTION

1. Field of the Invention

The invention relates to a method and an apparatus according to the preamble of claims i and 13 for loading an adapter for a printed circuit board testing device.

2. Description of the Related Art

From practical operation a method and an apparatus of this kind are known which for each arrangement of the adapter pins uses an individual main magazine and an associated intermediate magazine and a common so-called locking packet. The selection plate is fastened to the intermediate magazine. The diameter of the holes in the main magazine, in the intermediate magazine including the selection plate and in the locking packet is smaller than the diameter of the heads and at least equal to that of the shafts of the adapter pins. The adapter pins thus hang by their heads in the main magazine, in the intermediate magazine and in the locking packet.

The procedure for transferring a first arrangement of adapter pins from a first main magazine into the adapter is as follows:

1. Transporting the main magazine filled with the adapter pins underneath the open locking packet,
2. lifting and thereby transferring the adapter pins into the locking packet by lifting them by means of a hole-free plate moved from below towards the main magazine,
3. closing the locking packet to hold the transferred adapter pins,
4. removing the main magazine that has been completely emptied,
5. transporting the empty intermediate magazine with the selection plate facing upwards beneath the closed locking packet,
6. opening the locking packet so that the adapter pins to be loaded into the adapter fall with their contact ends first through the selection plate into the intermediate magazine,
7. closing the locking packet to hold the remaining adapter pins,
8. removing the loaded intermediate magazine,
9. transporting the empty main magazine beneath the closed, partly filled locking packet,
10. opening the locking packet so that the remaining adapter pins therein fall back into the main magazine with their contact ends first,
11. removing the partly emptied main magazine,
12. transporting the loaded intermediate magazine beneath the open empty locking packet,
13. lifting the adapter pins and transferring them into the locking packet in the same way as described in step 2,
14. closing the locking packet to hold the transferred adapter pins,
15. removing the empty intermediate magazine,
16. transporting the empty adapter beneath the closed partly filled locking packet,
17. opening the locking packet so that the adapter pins therein fall into the adapter with their contact ends first,
18. removing the filled adapter.

These 18 steps are repeated using a second intermediate magazine if the adapter is additionally to be loaded by a second arrangement of adapter pins from a second main magazine.

It is an object of the invention to further develop the method and apparatus of the kind mentioned in the introduction so that the adapter can be loaded more simply and quickly and with less constructional outlay.

This object is achieved according to the invention by the characterizing features of claims 1 and 13. In this way it is possible to reduce the number of process steps from 18 or 36 to 6 or 12 steps and to use only one intermediate magazine even when loading the adapter with adapter pins in various arrangements and to dispense with the locking packet completely.

The transfer of a Single arrangement of adapter pins is advantageously done by means of the following steps:

1. The empty intermediate magazine is placed on the full main magazine by relative movement in which the closing plate is arranged on the upper side of the intermediate magazine opposite the main magazine and the selection plate is arranged between the main magazine and the intermediate magazine,
2. the intermediate magazine and the main magazine are tilted together through about 180° so that the adapter pins to be loaded into the adapter fall through the selection plate with their contact heads first into the intermediate magazine,
3. the partly emptied main magazine is removed,
4. the empty adapter is placed with its side holding the heads of the adapter pins when in the loaded state by relative movement on to the side of the loaded intermediate magazine facing away from the closing plate,
5. the adapter and the intermediate magazine are tilted together through about 180° so that the adapter pins fall into the adapter with their contact ends first,
6. the loaded adapter is removed.

If the adapter is to be loaded additionally with a second arrangement of adapter pins it is then advantageously tilted through about 90° so that it is on edge. The following steps can then ensue:

7. Repetition of the aforementioned step 1, but with a second main magazine that is loaded with the adapter pins of the second arrangement,
8. repetition of the aforementioned step 2, but with the second main magazine,
9. repetition of the aforementioned step 3, but with the second main magazine,
10. the intermediate magazine loaded with the adapter pins from the second main magazine is tilted through about 90° so that it is on edge and by relative movement is placed against the adapter, loaded with adapter pins from the first main magazine, that has already been tilted on edge—this prevents adapter pins from falling out of the intermediate magazine, which would be the case if it had been tilted through 180° to place it on the adapter located in the horizontal position after step 6,
11. the intermediate magazine and the adapter are tilted together through 90° so that the adapter pins fall into the adapter with their contact ends first and the intermediate magazine remains behind empty,
12. the completely loaded adapter is removed.

It is also possible, after transferring the adapter pins from the first main magazine into the intermediate magazine, to transfer further adapter pins that are to be loaded into the adapter from one or several further main magazines successively into the intermediate magazine with their heads first under gravity.

It is advantageous to tilt the intermediate magazine loaded with adapter pins from at least the first main magazine through about 90° so that it is on edge and, after placing it against a further main magazine likewise on edge to tilt them back together through about 90° so that the adapter pins are transferred under gravity from the further main magazine into the intermediate magazine. After removing this main magazine the aforementioned steps 4 to 6 or 10 to 12 are advantageously carried out, steps 10 to 12 being carried out analogously with an empty adapter and with the intermediate magazine loaded with adapter pins from the first and the further main magazine. Obviously the aforementioned procedure for transferring the adapter pins from the main magazine to the intermediate magazine and to the adapter, in each case by tilting them twice through 90°, can also be used to load a still empty intermediate magazine and still empty adapter with adapter pins from the first main magazine by modifying steps 1 to 6.

According to a modification of the method the adapter pins that have been transferred from at least one main magazine into the intermediate magazine can be held securely by closing a clamping device adjacent to the closing plate, whereupon the intermediate magazine with the securely held adapter pins is tilted through about 180° and placed on the adapter so that after the clamping device is opened the adapter pins are transferred under gravity into the adapter with their contact ends first. In this way the intermediate magazine can be tilted together with the adapter through 180° instead of twice through 90°.

To obtain the same advantage when transferring adapter pins of a further arrangement into the intermediate magazine, after closing the clamping device and tilting through about 180° the loaded intermediate magazine is preferably placed on a further main magazine and tilted again with it through about 180° so that after releasing the clamping device again the adapter pins are transferred under gravity from the further main magazine into the intermediate magazine with their heads first.

After this the adapter is advantageously placed with its side holding the heads of the adapter pins when in the loaded state on the side of the loaded intermediate magazine facing away from the closing plate and after closing the clamping device is tilted together with the intermediate magazine through about 180°, so that after releasing the clamping device the adapter pins are transferred to the adapter with their contact ends first.

The main magazine preferably comprises at least two perforated plates arranged parallel to and spaced from one another having holes arranged coaxially at the aforementioned grid points, their diameters being smaller than the diameters of the heads and at least equal to the diameters of the shaft section of the adapter pins to be accommodated.

Similarly the intermediate magazine can likewise comprise at least two perforated plates arranged parallel to and spaced from one another having holes arranged coaxially at the aforementioned grid points with a diameter that is at least equal to the diameter of the heads of the adapter pins.

The clamping device preferably comprises a clamping plate that is arranged between the two perforated plates and that can be moved in its plane from an open position to a closed position, having holes arranged at the aforementioned grid points whose diameters are at least equal to the diameter of the heads of the adapter pins such that when the clamping plate is in its open position it holes are arranged centrally with the holes of the perforated plates and eccentrically thereto when it is in its closed position. The clamping device can be urged by a spring into its closed position.

The method according to the invention can be carried out both manually and mechanically. For this purpose a transporting arrangement is advantageous with which the main magazine, the intermediate magazine and the adapter can be transported relative to one another into positions in which the adapter pins can be transferred under gravity from the main magazine to the intermediate magazine and thence into the adapter.

BRIEF DESCRIPTION OF THE DRAWINGS

The invention will now be described in more detail with reference to three variants of the method and two exemplary embodiments of an apparatus for carrying out the method shown in the drawings, in which:

FIGS. 1–11 show the first exemplary embodiment of the apparatus and a sequence of steps of the first method, wherein the main magazine and the adapter in FIGS. 1, 5 and 9 are shown in plan from above, and in FIGS. 2–4, 6–8, 10 and 11 are sectioned along the lines II—II in FIG. 1, VI—VI in FIG. 5 and X—X in FIG. 9, and the intermediate magazine is shown throughout in section.

DETAILED DESCRIPTION OF THE PREFERRED EMBODIMENTS

The apparatus according to the invention shown in FIGS. 1–23 includes two main magazines 1, 2 and an intermediate magazine 3 or 4 for loading an adapter 5.

Figure 9:
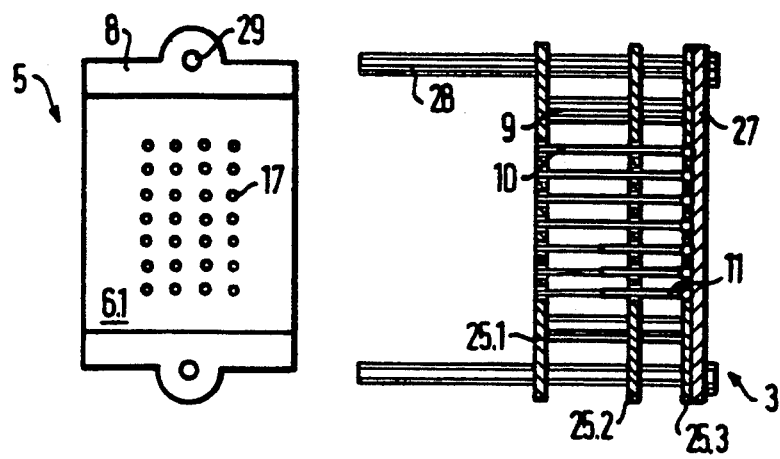
Figure 10:
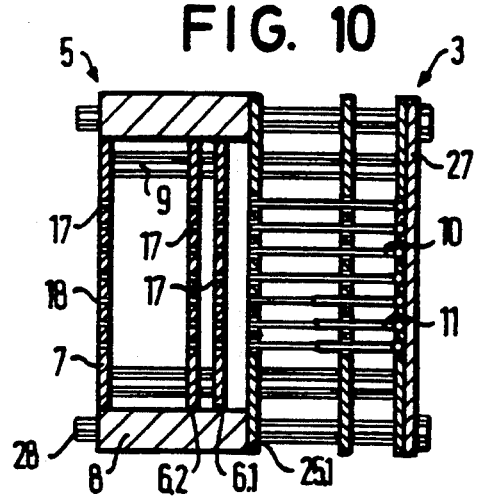
Figure 11:
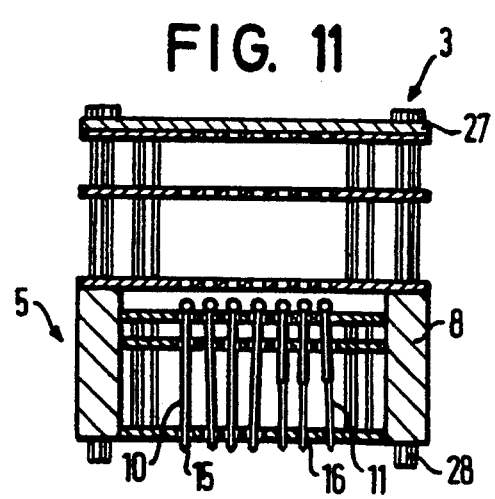
Figure 12:
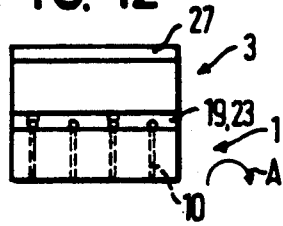
FIGS. 12–15 show schematically a sequence of steps of the second method.

The adapter 5 comprises in known manner—see FIGS. 10 and 11—three perforated plates 6.1, 6.2 and 7 which are fastened in a frame 8 in which they are held spaced from one another by spacer and fastening bolts 9. The perforated plates 6.1-7 are provided with through holes for receiving adapter pins 10 of a first arrangement and adapter pins 11 of a second arrangement. For simplicity both arrangements are represented in FIGS. 1–11 by only four adapter pins 10 and three adapter pins 11 and in FIGS. 16–21 by two adapter pins 10 and 11 respectively. The adapter pins of both arrangements each comprise a shaft of which one end has a head 12 and the other end is formed as a contact end. The shafts of the adapter pins 10 of the first arrangement are indicated by the numeral 13 and have the same diameter over their entire length, while the shafts of the adapter pins 11 of the second arrangement comprise a first shaft section 14.1 next to the head 12 and an adjoining second shaft section 14.2 of smaller diameter. The diameter of the first shaft section 14.1 is equal to the diameter of the shafts 13 of the adapter pins 10 which merge into contact ends 15. The contact ends of the adapter pins 11 are indicated by the numeral 16.

The holes in the perforated plates 6.1 and 6.2 are indicated by the numeral 17 and have a diameter that is smaller than the diameter of the heads 12 of the adapter pins 11 and at least equal to the diameter of the shafts 13. The holes in the outer perforated plate 6.1, like the holes 17 in the perforated plate 6.2 located beneath it, are arranged at the points of the grid of the test contact arrangement of a printed circuit board testing device (not shown) but slightly offset from one another. As shown in FIG. 11 the adapter pins 10 and 11 are arranged in the adapter 5 hanging by their heads 12 supported by the perforated plate 6.1. Their shaft sections adjacent to the contact ends 15 and 16 project through holes 17 and 18 respectively in the other perforated plate 7. The diameters of the holes 17 and 18 correspond to the diameter of the shafts 13 or to the second shaft section 14.2 of the adapter pins 10 and 11 that are respectively accommodated in them. The holes 17 and 18 are arranged partly on the grid and partly off the grid, as is shown by the slightly skew hanging adapter pins 10—second and fourth pin from the left in FIG. 11—and adapter pins 11—first pin from the right in FIG. 11—and form a hole pattern which corresponds with the hole pattern of the test contacts of the printed circuit board to be tested by the printed circuit board testing apparatus.

The main magazine 1 shown in FIGS. 2–4 is filled with the adapter pins 10 and the main magazine 2 shown in FIGS. 6–8 is filled with the adapter pins 11. Unlike in the drawing, in practice there are more holes for receiving adapter pins in the main magazine than there are in the adapter.

Detachably fastened to the outsides of the main magazines 1 and 2 are selection plates 19 and 20 which have through holes of the same diameter but arranged in different hole patterns. The hole pattern of the through holes in the select, on plate 19 corresponds to the hole pattern of the holes 17 and that of the through holes in the selection plate 20 corresponds to the hole pattern of the holes 18 in the perforated plate 7 of the adapter 5. Otherwise the construction of the main magazines 1 and 2 is identical and will be described below.

The main magazines 1, 2 each comprise four parallel plates attached to one another and having through holes that are arranged coaxially at the points of the aforementioned grid of the test contact arrangement of the printed circuit board testing device and serve to receive the adapter pins 10 and 11. Three of the perforated plates and their holes are indicated by the numerals 21.1, 21.2, 21.3 and 22 and are held apart from one another by means of fastening and spacer bolts 9. The holes 22 have a diameter that is smaller than the diameter of the heads 12 and at least equal to the diameter of the shafts 13 of the adapter pins 10. The fourth perforated plate and its holes are indicated by the numerals 23 and 14 respectively and is attached directly to the outside of the outer perforated plate 21.3. The diameter of the holes 24 is at least equal to the diameter of the heads 12 of the adapter pins 10 and 11 which, as a result of the arrangement of the perforated plates 21.1, 21.3 and 23 described above, are arranged in the main magazine 1, 2 hanging by their heads 12 accommodated in the holes 24 of the perforated plate 23 and supported by the perforated plate 21.3 located below.

The selection plate 19 or 20 is fastened directly to the outside of the perforated plate 23 and provided with through holes arranged coaxially with the holes 24 thereof and having the same diameter and likewise having the same reference numeral 24. The number of through holes 24, however, is smaller than the number of holes 22, 24 in the perforated plates 21.1–21.3 and 23; it corresponds to the number of adapter pins 10 and 11 to be loaded into the adapter 5.

The intermediate magazine 3 shown in section in FIGS. 1–11 comprises three identical perforated plates 25.1, 25.2, 25.3 that arranged in parallel and held apart from one another by fastening and spacer bolts 9, and having through holes 26 that are arranged coaxially at the aforementioned grid points and have a diameter at least equal to the diameter of the heads 12 of the adapter pins 10 and 11. A closing plate 27 without holes is fastened detachably to the outer side of the perforated plate 25.3 by means of guide bolts 28 which extend at right angles to the plane of the plates 25.1–25.3, 27 and project beyond the perforated plate 25.1 on the side remote from the closing plate 27 by an amount that is at least equal to the thickness of the main magazine 1, 2. Bores 29 to accommodate the guide bolts 28 are made in the main magazines 1 and 2 and in the adapter 5 and, like the guide bolts 28, are arranged with respect to the holes 26 of the intermediate magazine 3, 4, relative to the holes 22, 24 and 17 of the main magazine 1, 2 and of the perforated plate 6.1 of the adapter 5, so that these holes 26, 22, 24, 17 are aligned coaxially with one another when the guide bolts 28 are accommodated in the bores 29. Guide bolts 28 and bores 29 thus represent an aligning device.

Figure 22:
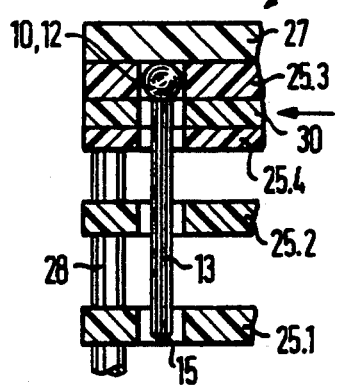
FIGS. 22 and 23 show cutaway sectional views of the intermediate magazine shown in FIGS. 16–21.
Figure 23:
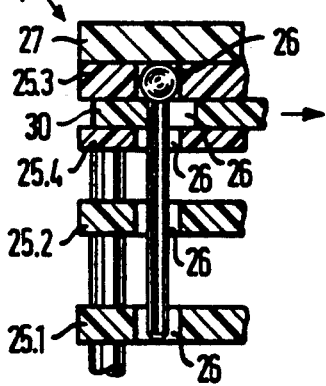

The intermediate magazine 4 shown in section in FIGS. 22 and 23 is identical to the intermediate magazine 3 except for a clamping plate 30 arranged between the perforated plates 25.3 and 25.2 and a perforated plate 25.4 supporting it. The clamping plate 30 can be moved between the perforated plates 25.3 and 25.4 from an open position to a closed position. Like the perforated plates 25.1 to 25.4 it is also provided with holes which are arranged at the aforementioned grid points and have a diameter that is at least equal to the diameter of the heads of the adapter pins 10 and 11. In the open position the holes 26 of the clamping plate 30 are central with the holes 26 of the perforated plates 25.1–25.4 and when in the closed position are arranged eccentrically thereto. The clamping plate 30 is held resiliently in the closed position by means not shown.

The method shown in FIGS. 1–11 will now be described, starting from the step shown in FIG. 1 in which the main magazine 1 filled with adapter pins 10 is arranged horizontally with the selection plate 19 facing upwards next to the empty intermediate magazine 3 which, with its plates 25.1–25.3 and 27 extending vertically, is tilted on edge through 90° relative to the horizontal. The closing plate 27 is arranged on the side of the intermediate magazine 3 remote from the main magazine 1.

Step 1: The main magazine 1 is tilted clockwise through 90° so that it is on edge, placed on the guide bolts 28 and moved along them until it abuts with the intermediate magazine 3; the main magazine 1 and the intermediate magazine 3 form the packet 1, 3 shown in FIG. 2 in which the selection plate 19 and the perforated plate 25.1 adjoin one another.

Step 2: The packet 1, 3 is tilted clockwise through 90° until it is in the horizontal position shown in FIG. 3 in which the main magazine 1 is located above the intermediate magazine 3 so that those adapter pins 10 that are in the holes 22 and 24 of the perforated plates 21.13–21.3 and 23 that are coaxial with the holes 24 of the selection plate 19 fall under gravity with their heads 12 first through the holes 24 of the selection plate 19 into the coaxial holes 26 of the perforated plates 25.1–25.3 of the intermediate magazine 3 until they abut with the closing plate 27. In this way the adapter pins 10 to be loaded into the adapter 5 are transferred from the main magazine 1 into the intermediate magazine 3; for simplicity these are only the four adapter pins shown in FIG. 1 in heavy lines in the outer right-hand row along the line II—II. The remaining three adapter pins which are supported by the regions of the selection plate 19 that have no holes remain in the main magazine 1.

Step 3: The packet 1, 3 is tilted counter-clockwise through 90° until it reaches the position shown in FIG. 4 which, apart from the altered distribution of the adapter pins 10 between the main magazine 1 and the intermediate magazine 3, is the same as the position shown in FIG. 2.

Step 4: The partly emptied main magazine 1 is separated from the partly loaded intermediate magazine 3 by moving it along the guide bolts 28 and tilted through 90° back into the horizontal position. The partly loaded intermediate magazine 3 remains on edge. This is shown in FIG. 5 which also shows, alongside the intermediate magazine 3, the main magazine 2 filled with adapter pins 11 and lying in the horizontal position with the selection plate 20 facing upwards.

By steps 5 to 7 the adapter pins 11 to be loaded into the adapter 5 (for simplicity of the total of seven adapter pins these are merely the three indicated in heavy lines in FIG. 5 in the outer right-hand row along the line VI—VI) are transferred from the main magazine 2 through the selection plate 20 into the intermediate magazine 3 in the same way as the adapter pins 10 are transferred from the main magazine 1 according to steps 1 to 3, whereupon, by step 8, the main magazine 2 with the remaining four adapter pins 11 is separated from the intermediate magazine 3 just as the main magazine 1 was in step 4. The steps of the method shown in FIGS. 5–8 correspond to those shown in FIGS. 1–4. The intermediate magazine 3 loaded with all the adapter pins 10, 11 to be loaded in the adapter 5 remains on edge. This is shown in FIG. 9, which also shows the empty adapter 5 in the horizontal position next to the intermediate magazine 3 and with its perforated plate 6.1 facing upwards.

The adapter pins 10, 11 located in the intermediate magazine 3 are transferred to the adapter 5 by the following four steps:

Step 9: The empty adapter 5 is tilted through 90°, in the same way as the main magazine 1, 2, so that it is on edge and placed against the intermediate magazine 3 to form the packet 3, 5 shown in FIG. 10, in which the perforated plates 5.1 and 6.1 face one another.

Step 10: The packet 3, 5 is tilted counter-clockwise through 90° until it is in the horizontal position shown in FIG. 11, in which the intermediate magazine 3 is arranged above the adapter 5 so that all the adapter pins 10, 11 seated in the coaxial holes 26 of the intermediate magazine 3 fall under gravity, with their contact ends 15, 16 first, into the holes 17, 18 of the perforated plates 6.1, 6.2 and 7 of the adapter 5. The adapter 5 is thus loaded with all the adapter pins 10, 11 necessary for testing the printed circuit board. The intermediate magazine 3 remains behind completely empty.

Step 11: The completely loaded adapter 5 is removed from the intermediate magazine 3.

Step 12: The empty intermediate magazine 3 is tilted through 90° into the on-edge position shown in FIG. 1 whereupon the process can begin anew.

According to the variant of the method shown in FIGS. 12–15 the adapter 5 is only loaded with the adapter pins 10 of the first arrangement. The following six steps are required for this.

Step 1: The empty intermediate magazine 3 is placed with its perforated plate 25.1 on to the selection plate 19 of the main magazine 1 filled with adapter pins 10—for simplicity only four adapter pins are shown—to form the packet 1, 3 shown in FIG. 12.

Figure 13:
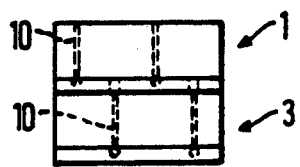
Figure 14:
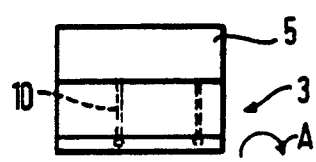
Figure 15:
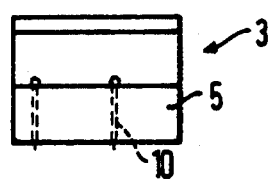
Figure 16:
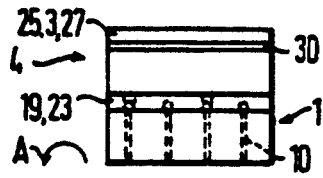
FIGS. 16–21 show schematically a sequence of steps of the third method.

Step 2: The packet 1, 3 is tilted through 180° in the plane of the drawing as indicated by the arrow A, as shown in FIG. 13, so that the main magazine 1 is arranged above the intermediate magazine 3 and, according to the pattern of holes in the selection plate 19, half of the adapter pins 10 are transferred under gravity with their heads 12 first into the intermediate magazine 3.

Step 3: The partly emptied main magazine 1 is removed from the loaded intermediate magazine 3.

Step 4: The empty adapter 5 is placed with its perforated plate 6.1 on to the perforated plate 25.1 of the intermediate magazine 3 to form the packet 3, 5 shown in FIG. 14.

Step 5: The packet 3, 5 is tilted through 180° in the direction of the arrow A, i.e. in the plane of the drawing, into the position shown in FIG. 15 in which the intermediate magazine 3 is arranged above the adapter 5 so that all the adapter pins 10 in the intermediate magazine 3 are transferred under gravity with their contact ends 15 first into the adapter 5. The empty intermediate magazine 3 remains behind.

Step 6: The loaded adapter 5 is removed from the empty intermediate magazine 3, whereupon the method can begin anew or, after tilting the intermediate magazine 3 into the on-edge position shown in FIG. 1, the adapter 5 can be loaded with the adapter pins 11 from the main magazine 2 according to the steps 5 to 10 described above.

In the method shown in FIGS. 16–21, instead of using the intermediate magazine 3 the intermediate magazine 4 having the clamping plate 30 shown in FIGS. 22, 23 is used. The procedure is as follows:

Step 1: The empty intermediate magazine 4 with the clamping plate 30 in the opening position is placed with its perforated plate 25.1 on the selection plate 19 of the main magazine 1 filled with adapter pins 10—for simplicity only four adapter pins are shown—to form the packet 1.4 shown in FIG. 16.

Figure 17:
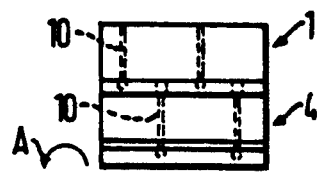

Step 2: The packet 1.4 is tilted through 180° in the plane of the drawing as indicated by the arrow A, so that the main magazine 1, as shown in FIG. 17, is arranged above the intermediate magazine 4 and, according to the pattern of holes in the selection plate 19, half of the adapter pins 10 are transferred under gravity with their heads first 12 into the intermediate magazine 4.

Step 3: The clamping plate 30 closed, as indicated by the arrow B in FIG. 18.

Figure 18:
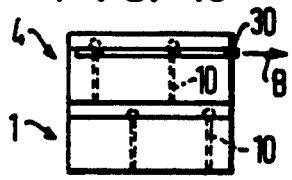
Figure 19:
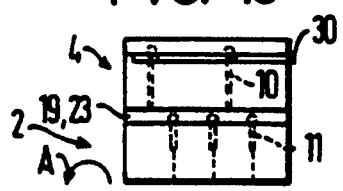

Step 4: The packet 1, 4 with the closed clamping plate 30 is tilted through 180° in the direction of the arrow A, i.e. in the plane of the drawing, so that the partly loaded intermediate magazine 4 is arranged above the partly emptied main magazine 1, as shown in FIG. 18.

Step 5: The partly emptied main magazine 1 is removed so that the partly loaded intermediate magazine 4 remains.

Step 6: The partly loaded intermediate magazine 4 with the closed clamping plate 30 is placed with its perforated plate 25.1 on the selection plate 20 of the main magazine 2 filled with adapter pins 11—for simplicity on three adapter pins 11 are shown—to form the packet 2.4 shown in FIG. 19.

Figure 20:
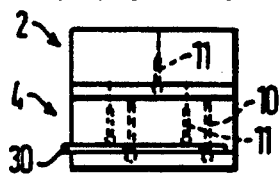
Figure 21:
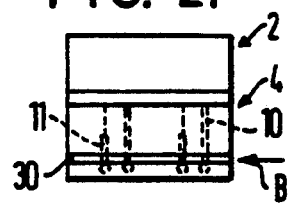

Step 7: The packet 2.4 is tilted through 180° as indicated by the arrow A in the plane of the drawing so that the main magazine 2, as shown in FIG. 20, is arranged above the partly loaded intermediate magazine 4 and, according to the pattern of holes in the selection plate 20, two thirds of the adapter pins 11 are transferred under gravity with their heads 12 first into the intermediate magazine 4 until they reach the position above the closed clamping plate 30 shown in FIG. 20.

Step 8: The clamping plate 30 is moved, as indicated by the arrow B, into the open position so that the adapter pins 11 fall into the intermediate magazine 4 in the position shown in FIG. 21 in which they bear with their heads 12 against the closing plate 27.

Step 9: The clamping plate 30 is closed.

Step 10: The partly emptied main magazine 2 is removed from the loaded intermediate magazine 4.

Step 11: The empty adapter 5 is placed with its perforated plate 6.1 on the perforated plate 25.1 of the intermediate magazine 4, forming a packet 4, 5.

Step 12: The packet 4, 5 is likewise tilted through 180° in the plane of the drawing so that the loaded intermediate magazine 4 is arranged above the empty adapter 5.

Step 13: The clamping plate 30 is moved into the open position so that all the adapter pins 10, 11 located in the intermediate magazine 4 are transferred under gravity with their contact ends first 15, 16 into the adapter 5.

Step 14: The loaded adapter 5 is removed, and the empty intermediate magazine 4 is available for repeating the steps of the method.

Figure 24:
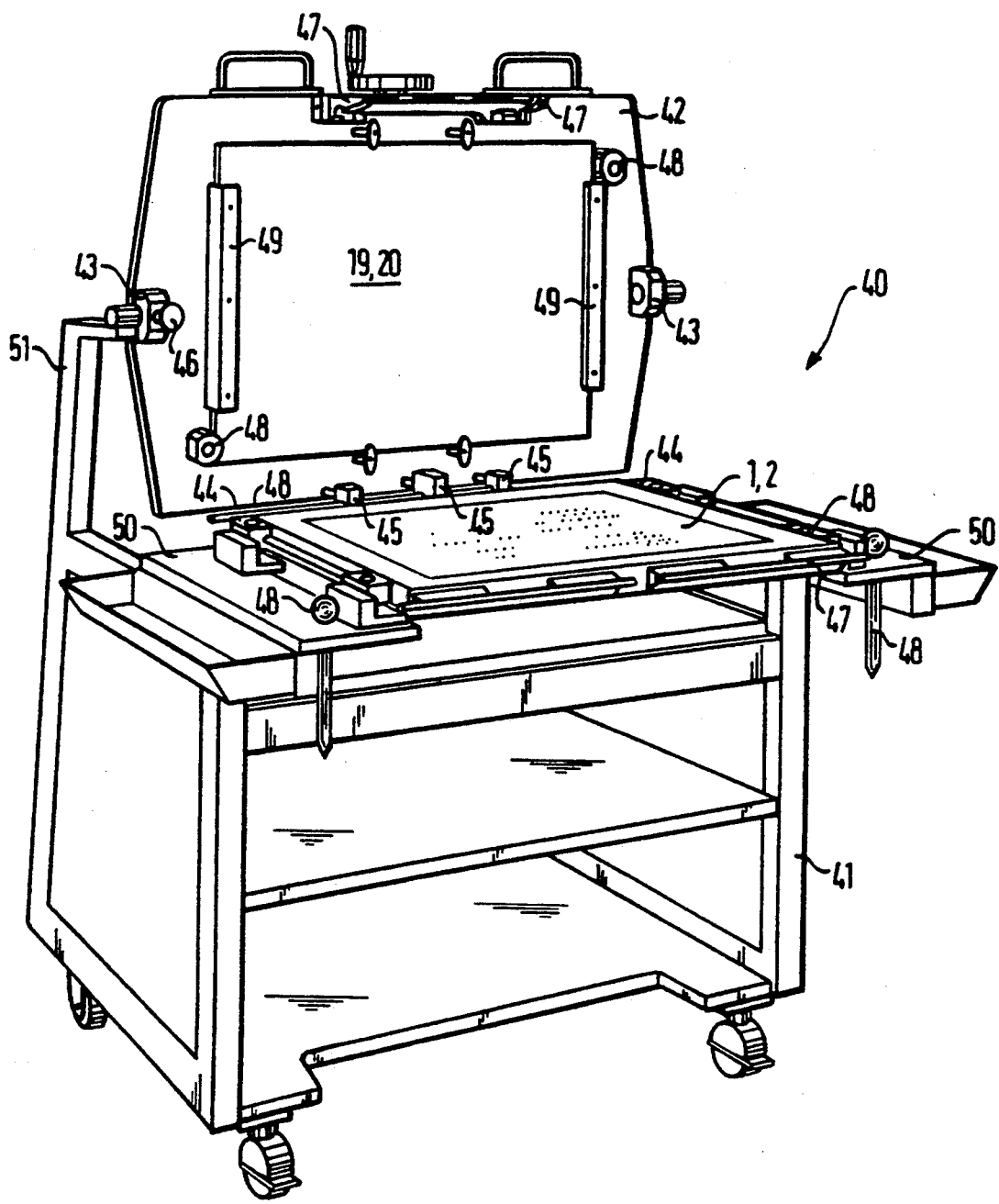
FIG. 24 shows a perspective view of the second exemplary embodiment of the apparatus.

The second exemplary embodiment of the device according to the invention shown in FIG. 24 is also suitable for both loading and unloading the adapter and has in addition to the device, described above a transporting device 40 with which the main magazine 1, 2, the intermediate magazine and the adapter can be transported relative to one another to positions in which the adapter pins can be transferred by gravity from the main magazine 1, 2 to the intermediate magazine and thence to the adapter, and from the latter back to the main magazine via the intermediate magazine.

The transporting arrangement 40 includes a moveable frame stand 41, a tilting device with a plate-shaped tilting holder 42 and a tilting bearing 43, a pivoting device with a frame-shaped pivoting holder 44 and a pivoting bearing 45, a arresting device 46, a locking device 47, an aligning device 48 and a fastening device 49.

The movable frame stand 41 includes a substantially horizontal table plate 50 which has vertical supporting arms 51 projecting beyond each of its rear corner regions. The plate-shaped tilting holder 42 is mounted by means of the tilting bearing 43 on the free ends of the supporting arms 51 so that it can be tilted substantially at right angles to its plane about a horizontally extending tilting axis. The horizontal axis runs through the centre of gravity of the plate-shaped tilting holder 42, which can be held in a substantially vertical or on-edge position (see FIG. 24) by means of the arresting device 46. The arresting device 46 comprises two movably guided stop bolts which are spring-loaded to engage in and block the tilting bearing 43 on both supporting arms 51. When the arresting device is released the plate-shaped tilting holder 42 can be tilted through at least 180° and can be moved into two substantially horizontal positions.

Fixing attachments (not shown) serve to detachably fix the intermediate magazine to the plate-shaped tilting holder 42 and to fix the main magazine 1 or 2 or the adapter to the free-shaped pivoting holder 44. The latter is linked to the edge via the pivoting bearing 45 with a horizontal pivot axis to the lower edge region of the plate-shaped tilting holder 42 located in the on-edge position and can thus be pivoted substantially at right angles to its plane from, for example, the horizontal position shown in FIG. 24 in which it lies on the table plate 50, until it bears on the tilting holder 42 located in the on-edge position. By means of the locking device 47 both holders 42, 44, together with the intermediate magazine and main magazine or adapter respectively mounted on them, can be locked together and, after releasing the arresting device 46, can be tilted together, e.g. until they reach both the horizontal positions mentioned, in one of which, in loading, the adapter pins are transferred by gravity from the main magazine 1, 2 into the intermediate magazine, or in back-loading are transferred from the adapter into the intermediate magazine. By tilting the holders 42, 44 that are locked together clockwise (looking at FIG. 24 from the left) the other horizontal position can be reached, in which the adapter pins are transferred from the intermediate magazine into the adapter when loading, or from the intermediate magazine into the main magazine when back-loading. The locking device 47 includes corresponding locking elements which are arranged on the edge regions of both holders 42, 44 opposite the pivoting bearing 45.

Clearance in the pivoting bearing and in the mounting devices is compensated by the aligning device 48 so that the holes in the intermediate magazine mounted on the tilting holder 42 and those in the main magazine or adapter mounted on the pivoting holder 44 are coaxial with one another when both holders 42, 44 are folded together and locked together by the locking device 47. The aligning device 48 comprises two diagonally opposed bores in each holder 42, 44 and two guide bolts that can be inserted in these bores which, when they are not in use, can be hung in the table plate as shown in FIG. 24.

The fastening device 49 comprises two spaced fastening strips attached to the tilting holder 42 which serve to detachably fasten the selection plate 19 or 20 to the intermediate magazine. Compared with the other possibility of fastening it to the main magazine 1 or 2, this alternative means of fastening the selection plate 19, 20 to the intermediate magazine simplifies back-loading the different arrangement of adapter pins from the adapter into the respective intermediate magazine and from the latter into the respective main magazine 1 or 2.

The apparatus according to the invention shown in FIG. 24 can be equipped with appropriate means in order to use the alternative embodiments of the main magazine and the adapter (not shown) which will now be described.

Instead of having the three identical perforated plates of the embodiment described with reference to FIGS. 1 to 11, each of the main magazines according to the alternative embodiment can have only two such perforated plates, i.e. the perforated plate 21,3 and the perforated plate 21,2 that can be moved to change its distance from the first plate. While the adapter pins are being transferred from the main magazine to the intermediate magazine as shown in FIG. 3 the perforated plate 21,2 lying on the perforated plate 21,3 is merely lifted by the aforementioned means to change the distance apart. In this way sufficient guidance of the adapter pins and thus problem-free transfer into the intermediate magazine is achieved. In the same way the perforated plate 21,2 is lifted while the adapter pins are returned from the intermediate magazine into the main magazine, but in this case to reduce the distance apart and to transfer the adapter pins with the contact ends first into the main magazine without difficulty.

In the same way the adapter according to the alternative embodiment is provided with an additional perforated plate which is identical to the perforated plate 6,1 and can be moved so that the distance from it can be changed. Furthermore the perforated plates 6.2 and 7 can be removed from or inserted into the adapter as a unit. While the adapter pins are being transferred from the intermediate magazine into the adapter as shown in FIGS. 10 and 11, with the unit 6.2,7 inserted, the additional perforated plate is lifted by the aforementioned means to reduce the distance and thus to facilitate transfer of the adapter pins into the adapter. In the same way, while the adapter pins are being transferred back from the adapter (for which purpose the unit 6.2,7 is removed from the adapter) into the intermediate magazine the additional perforated plate is lifted, but in this case to increase the distance so that in this way sufficient guidance of the adapter pins and thus problem-free transfer thereof with their heads first into the intermediate magazine is achieved. Furthermore the device according to the invention shown in FIG. 24 can be provided with means which, for example during transfer of the adapter pins from the intermediate magazine into the adapter, make it possible to increase the distance between the intermediate magazine and adapter, likewise to facilitate the transfer of adapter pins.

We claim:

1. An apparatus for loading an adapter for a printed circuit board testing device with adapter pins having enlarged heads and smaller contact ends, said apparatus comprising at least one main magazine which has holes for receiving adapter pins to hang by their heads, said holes being arranged at grid points of a test contact arrangement in a printed circuit board testing device; an intermediate magazine that has holes at the aforementioned grid points, said holes being larger than the holes of said main magazine for receiving adapter pins, head first from the main magazine; and at least one selection plate in which the holes are provided at the aforementioned grid points to form a hole pattern that corresponds at least in part to the hole pattern of the adapter, the holes in the selection plate being as large as the holes in said intermediate magazine, a hole-free closing plate fixed on one side of the intermediate magazine, the selection plate being arranged between the side of the main magazine that holds the heads of the adapter pins and the side of the intermediate magazine opposite the closing plate, the holes of the selection plate being formed as through holes that are coaxial with the holes of the main magazine and the intermediate magazine.

2. Apparatus according to claim 1, characterized in that the main magazine comprises at least two parallel, spaced apart perforated plates having holes arranged coaxially at the aforementioned grid points, of which the diameters are smaller than the diameter of the heads and at least equal to the diameter of the shaft sections of the respective adapter pins to be accommodated.

3. Apparatus according to claim 1 or characterized in that the intermediate magazine comprises at least two parallel, spaced apart perforated plates having holes arranged coaxially at the aforementioned grid points, of which the diameter is at least equal to the diameter of the heads of the adapter pins.

4. Apparatus according to claim 3, characterized in that the intermediate magazine comprises a clamping plate arranged between two of the perforated plates and moveable in their plane between an open and a closed position, having holes at the aforementioned grid points of which the diameter is at least equal to the diameter of the heads of the adapter pins, and in that the holes of the clamping plate are in their open position arranged centrally and in their closed position eccentrically to the holes of the perforated plates.

5. Apparatus according to claim 4, characterized in that the clamping plate is spring-loaded towards its closing position.

6. Apparatus according to claim 1, characterized by a transport device for transporting the main magazine, the intermediate magazine and the adapter relative to one another into positions in which adapter pins can be transferred by gravity from the main magazine into the intermediate magazine and thence into the adapter.

7. Apparatus according to claim 6, characterized in that the transport device includes a tilting device with a tilting holder to hold the intermediate magazine and a tilting bearing by means of which the tilting holder is mounted to be tiltable through at least 180° substantially at right angles to its plane and can be transferred into two substantially horizontal positions.

8. Apparatus according to claim 7, characterized by an arresting device to releasably arrest the tilting holder for the intermediate magazine in a substantially vertical or on-edge position of the intermediate magazine.

9. Apparatus according to claim 6, characterized in that the transport device includes a pivoting device that serves to pivot the main magazine or the adapter in a plane extending in the direction of the holes therein into contact with the intermediate magazine and back.

10. Apparatus according to claim 9, characterized in that the pivoting device includes a pivoting holder to hold the main magazine or the adapter and a pivoting bearing by means of which the pivoting holder is pivotably mounted substantially at right angles to its plane.

11. Apparatus according to claim 10, characterized in that the pivoting bearing is fixed to the tilting holder for the intermediate magazine.

12. Apparatus according to claim 10, characterized by a locking device for releasably locking the main magazine or the adapter or the pivoting holder thereof to the intermediate magazine or to the tilting holder thereof.

13. Apparatus according to at claim 7, characterized by a fastening device for releasably fastening the selection plate to the intermediate magazine or to the tilting holder thereof and/or to the main magazine or to the pivoting holder thereof.

14. Apparatus according to at claim 1, characterized by an aligning device for aligning the main magazine or the adapter and the intermediate magazine so that their holes are aligned coaxially to one another.

15. Apparatus according to claim 14, characterized in that the aligning device comprises at least two guide bolts fastened to the tilting holder for the intermediate magazine or to the intermediate magazine itself and projecting on the side thereof facing away from the closing plate and corresponding bores in the main magazine and adapter or in the pivoting holder thereof to receive the guide bolts.

16. Apparatus according to claim 14, characterized in that the aligning device comprises two guide bolts and two respective corresponding bores in the intermediate magazine or in the tilting holder thereof and in the main magazine and adapter or in the pivoting holder thereof to receive the guide bolts.

17. Apparatus according to claim 7, characterized in that the transport device comprises a moveable frame stand on which the tilting holder for the intermediate magazine is tiltably mounted by means of the tilting bearing.

* * * * *